United States Patent [19]

Schillhof et al.

[11] Patent Number: 5,963,081
[45] Date of Patent: Oct. 5, 1999

[54] CIRCUIT ARRANGEMENT HAVING AT LEAST TWO SIGNAL PATHS

[75] Inventors: Udo Schillhof, Itzstedt; Wilhelm Graffenberger, Hamburg, both of Germany

[73] Assignee: U.S. Philips Corporation, New York, N.Y.

[21] Appl. No.: 08/914,051

[22] Filed: Jul. 15, 1997

[30] Foreign Application Priority Data

Aug. 30, 1996 [DE] Germany ............................ 196 35 050

[51] Int. Cl.$^6$ ................................. G05F 1/10; G05F 3/02
[52] U.S. Cl. ............................................ 327/538; 327/132
[58] Field of Search .................................. 327/52, 69, 70, 327/71, 76, 78–81, 89, 132–135, 293, 403, 405, 411, 478, 482, 490, 538; 323/315

[56] References Cited

U.S. PATENT DOCUMENTS

| | | | |
|---|---|---|---|
| 5,796,243 | 8/1998 | Kimura ................................... | 323/312 |
| 5,796,276 | 8/1998 | Phillips et al. ........................... | 327/108 |
| 5,811,993 | 9/1998 | Dennard et al. ........................... | 327/54 |
| 5,883,546 | 3/1999 | Kaminishi et al. ...................... | 327/565 |

FOREIGN PATENT DOCUMENTS

| | | |
|---|---|---|
| 3200071A1 | 9/1982 | Germany . |
| 3222607A1 | 12/1983 | Germany . |
| 4332658A1 | 3/1995 | Germany . |

*Primary Examiner*—My-Trang Nuton
*Attorney, Agent, or Firm*—Steven R. Biren

[57] ABSTRACT

A circuit arrangement having at least two signal paths which can be alternately enabled by feeding respective controllable current sources and by logic signals selecting one of these controllable current sources, while, at a transition from one signal path to the other, the controllable current sources of the relevant two signal paths are controllable by a time-continuously changing control signal during a transition interval, such that currents which can be supplied by these two controllable current sources change continuously and in opposite directions.

The object of implementing this circuit arrangement in such a way that the number of components is noticeably reduced in a device enabling a gradual transition from one setting position to the next is achieved with a selection circuit (1) having a control stage (11; 21; 31; 41; 51) for each signal path (T18,T19; T28,T29; T38,T39; T48,T49; T58,T59), each control stage (11; 21; 31; 41; 51) including:

an analog multiplexer branch (T11,R1; T21,R2) through which a current can be passed which enables the controllable current source (I1; I2; I3; I4; I5) associated with the relevant signal path (T18,T19; T28,T29; T38, T39; T48,T49; T58,T59), said current being supplied from a reference current source (Iref) which is common to the multiplexer branches (T11,R1; T21,R2) of all control stages (11; 21; 31; 41; 51), a bistable stage (T14,T16,I11,I12; T24,T26,I21,I22) for continuously controlling the current in the multiplexer branch (T11,R1; T21,R2) in accordance with the control signal (UTR) and for storing the state of operation, achieved at the end of the transition interval (t3–t5), of the multiplexer branch (T11,R1; T21,R2) outside the transition interval (t3–t5), and a switching stage (I13,T15; I23,T25) for applying the control signal (UTR) during the transition interval (t3–t5), by the logic signals (s1; s2; s3; s4; s5) and via the bistable stage (T14,T16,I11,I12; T24,T26,I21,I22), to the multiplexer branch (T11,R1; T21,R2) of that signal path (T18,T19; T28,T29; T38,T39; T48,T49; T58,T59, respectively) which is to be enabled in accordance with the logic signals (s1; s2; s3; s4; s5) after termination (t5) of the transition interval (t3 to t5).

14 Claims, 4 Drawing Sheets

CIRCUIT ARRANGEMENT HAVING AT LEAST TWO SIGNAL PATHS

BACKGROUND OF THE INVENTION

1. Field of the Invention

The invention relates to a circuit arrangement having at least two signal paths which can be alternately enabled by feeding respective controllable current sources and by means of logic signals selecting one of these controllable current sources, while, at a transition from one signal path to the other, said controllable current sources of the relevant two signal paths are controllable by means of a time-continuously changing control signal during a transition interval, such that currents which can be supplied by these two controllable current sources change continuously and in opposite directions.

2. Description of the Related Art

DE-OS 32 00 071 discloses a signal transmission device with a stepwise adjustable transfer characteristic, comprising at least a group of controllable switches for applying a signal from different inputs to an output. The device comprises control means with which, each time, one of these switches is rendered conducting, and with which these switches can be rendered conducting and non-conducting by means of a control signal. The device also comprises a control signal generator for generating a first control signal uniformly changing as a function of time, with which a given switch from the group of controllable switches is gradually rendered conducting, and for generating a second control signal which is complementary to the first control signal and with which simultaneously another switch from said group of controllable switches is gradually rendered non-conducting.

DE-OS 32 22 607 discloses a circuit arrangement comprising a plurality of signal paths constituted by active circuits. Signals having different levels are supplied from a common output via these signal paths. The signal paths can be enabled by means of a switchable current source. Each current source is constituted by at least an $I^2L$ gate. These gates are divided into a first group and second group, and the injector terminals of the first group are connected to a first junction point and the injector terminals of the second group are connected to a second junction point. The control inputs of the $I^2L$ gates are controlled in such a way that, at the transition from one signal path to another, two $I^2L$ gates associated with one of the signal paths and with one of the groups can convey current at least during a transition phase. The junction points are chosen to be such that the output currents of the two $I^2L$ gates change continuously and in opposite directions during the transition phase.

In these known circuit arrangements, the transition from one setting position to the next is extended and rounded for a predetermined period of time. This reduces interfering noise occurring during the setting process and caused by operating point offsets, voltage pulses and modulation effects. Particularly, audible signal interferences can be suppressed when this circuit arrangement is used for audio signals.

However, it has been found that a proportionally high number of components is required for a practical implementation of the circuit arrangements described.

SUMMARY OF THE INVENTION

It is an object of the invention to implement a circuit arrangement of the type described in the opening paragraph in such a way that the number of components is noticeably reduced in a device enabling a gradual transition from one setting position to the next.

In a circuit arrangement according to the invention, this object is solved by a selection circuit comprising a control stage for each signal path, each control stage comprising:
  an analog multiplexer branch through which a current can be passed which enables the controllable current source associated with the relevant signal path, said current being supplied from a reference current source which is common to the multiplexer branches of all control stages,
  a bistable stage for continuously controlling the current in the multiplexer branch in accordance with the control signal (UTR) and for storing the state of operation, achieved at the end of the transition interval, of the multiplexer branch outside the transition interval, and
  a switching stage for applying the control signal during the transition interval, by means of the logic signals and via the bistable stage, to the multiplexer branch of that signal path which is to be enabled in accordance with the logic signals after termination of the transition interval.

In the circuit arrangement according to the invention, the number of components can be essentially reduced because, instead of extensive logic circuits, the controllable current sources which are present anyway for feeding the signal paths only have to be extended by control stages of a very simple construction. In addition to the analog change-over from one signal path to the other, these control stages incorporated in the selection circuit also take over the storage of the current state, independently of the logic signals which need only predetermine the switching state to be taken over by the circuit arrangement after the change-over. Thus, these logic signals can already present and prepare a new setting position while the signal paths are still in their current operating state by virtue of the circuit arrangement according to the invention. Moreover, the circuit arrangement according to the invention provides the very simple possibility of delaying the change-over with respect to the setting of the logic signals, so that delay time effects with which the logic signals may be beset and become manifest, for example, as voltage spikes, are suppressed effectively.

An advantageous embodiment of the circuit arrangement according to the invention is characterized in that each control stage comprises an inhibiting stage and that a common enable signal can be applied to all inhibiting stages, by which signal said inhibiting stages can be switched over during the transition interval so as to apply the logic signals to the switching stages and outside the transition interval so as to interrupt the supply of the logic signals. The inhibiting stages, which are only transmissive to the logic signals during the transition interval, prevent the logic signals of the transition interval from influencing the signal paths. Interference, which is due to changes of the logic signals outside the transition interval and is introduced via the control stages into the signal paths and consequently into a useful signal to be conveyed by these paths, can thus be prevented in a simple and accurate manner by means of the enable signal commonly switching over the inhibiting stages. Such interference particularly occurs in the form of needle pulses due to delay time effects, and if these are transmitted in the signal paths, a disturbing click will occur in the audio signal when this signal is, for example, transmitted in these signal paths. Moreover, the control signal is decoupled so that it can be commonly used for a plurality of control blocks.

A further embodiment of the circuit arrangement according to the invention is characterized in that one of the logic signals is allocated to each control stage, and in that this logic signal assumes a first signal level when the associated signal path is to be enabled after termination of the next transition interval, while, simultaneously all other logic signals assume a second signal level. Such logic signals may be preferably taken from a data transmission device which is implemented with a "1 of n" decoder. Then, the logic signals can be predetermined in a simple manner via an I$^2$C bus. Predetermined signal levels and power decoupling from the data transmission device can then be advantageously achieved in that each control stage comprises an inverter for applying the allocated logic signal to the associated switching stage and inhibiting stage, respectively.

The signal paths in the circuit arrangement, according to the invention, can be fed and controlled in a very simple manner in that each controllable current source comprises a current-mirror circuit having an input branch to which the current enabling the controllable current source can be applied from the associated multiplexer branch and an output branch which feeds the associated signal path.

In an embodiment of the circuit arrangement, according to the invention, which has a particularly low number of components, each bistable stage comprises a holding-current branch which is controllable by the input branch of the associated controllable current source and from which a holding current for storing the corresponding state of operation of the associated multiplexer branch can be taken when the associated signal path is enabled. In fact, such a holding-current branch may be constituted by a single transistor which is added to the current-mirror circuit of the relevant controllable current source. This holding-current branch supplies a current whenever the controllable current source connected thereto conveys a current. The switching state of the associated bistable stage is thereby directly derived from the switching state of the controllable current source without any extensive logic switching circuits being required.

An advantageous embodiment of the invention is characterized in that each bistable stage also comprises a first constant-current source which is connected to a first reference potential and, via a potential-shift element, to a junction point with the holding-current branch, and a second constant-current source which is connected to the junction point and to a second reference potential. The first constant-current source is preferably implemented in such a way that it can take up the holding current. The second constant-current source is particularly dimensioned for an essentially smaller current which can deplete possible residual charges or leakage currents, inter alia, when the holding-current branch is inhibited. The potential-shift element is also preferably implemented in such a way that it is conducting only in the forward direction of the holding current but is non-conducting in the opposite direction. In the absence of a holding current, said junction point can then be separated from the first constant-current source and hence from the first reference potential so that it can be connected to the second reference potential via the second constant-current source. The first reference potential is preferably higher than the second reference potential.

In accordance with another embodiment of the invention, each multiplexer branch comprises a control element having a control terminal which is connected to the associated bistable stage. More particularly, this control element is constituted by a transistor whose control terminal is connected to the junction point in the associated bistable stage. The multiplexer branch can thus be controlled by the bistable stage and with the aid of the switched-on or switched-off holding current and the reference potentials in the two operating states outside the transition interval.

The control of the multiplexer branches during the transition interval is advantageously rendered possible in that each switching stage comprises a switching element having a control terminal to which the allocated logic signal can be applied, in which case the control signal is applied by the switching element to the junction point of the associated bistable stage. More particularly, during the transition interval, the control signal has an at least substantially sawtooth-shaped waveform as a function of time. In the control stage associated with the signal path selected by the logic signal, a continuous change-over of the current from the associated controllable current source is thus realized during the transition interval. The logic signal then preferably selects the controllable current source whose current is to increase in the transition interval. Since the multiplexer branches of the control stages of this controllable current source and the current source enabled at the start of the transition interval have the reference current source in common, the currents enabling said controllable current sources will continuously change in mutually opposite directions in conformity with the control signal during the transition interval, while their sum corresponds to the current flowing through the reference current source. The desired continuous transition from one controllable current source to the other, and hence from one signal path to the other, is thus realized in a very simple manner.

Instead of the sawtooth-shaped waveform as a function of time of the control signal, a different, continuous waveform as a function of time may be alternatively chosen for this signal in so far as this is advantageous for the switch between the signal paths and the resultant effect on a useful signal to be conveyed in the signal paths.

In a preferred use of the circuit arrangement, according to the invention, each signal path comprises a differential amplifier stage to be fed by the associated controllable current source, said differential stages being enabled only when a current is applied to them by the controllable current source. Particularly, the outputs of all differential amplifier stages may be connected to a common output stage. In this respect, it is to be noted that such an arrangement of differential amplifier stages and a common output stage is known from DE-OS 43 32 658.

The circuit arrangement according to the invention is preferably suitable for use in a signal control element. This element may be advantageously used in a volume and/or sound control element for an audio signal, as is particularly used in audio signal reproducing devices. In these reproducing devices, the invention leads to a reduction of disturbing noise during the setting process for the audio signal, while using a very small number of components. The influence of DC level offsets, needle pulses or unwanted modulations can thereby be suppressed very effectively. The circuit arrangement according to the invention, using a small number of components, provides the possibility of generating a low-noise audio signal also in simple, inexpensive reproducing devices.

These and other aspects of the invention are apparent from and will be elucidated with reference to the embodiments described hereinafter.

BRIEF DESCRIPTION OF THE DRAWINGS

In the drawings.

Corresponding elements in the various Figures have the same reference signs.

DESCRIPTION OF THE PREFERRED EMBODIMENTS

Figure 1:
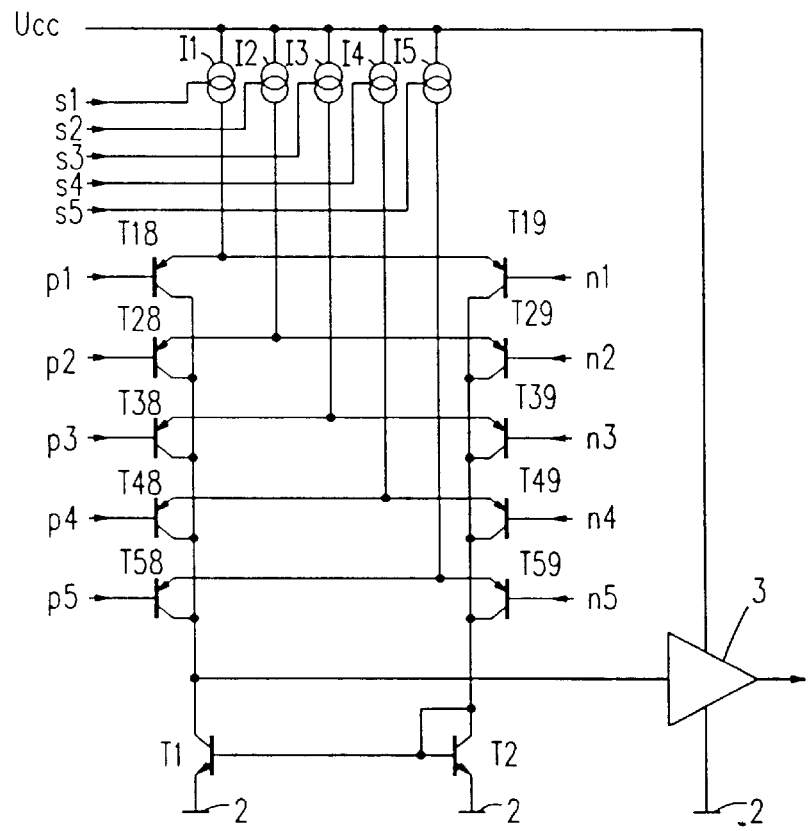
FIG. 1 shows an embodiment of an arrangement having a plurality of signal paths in which the present invention is used.

FIG. 1 shows an operational amplifier which can provide, for example, five different signal paths. Each signal path is constituted by a differential amplifier stage consisting of two emitter-coupled transistors of the PNP type. The first signal path comprises the transistors T18,T19, the second signal path comprises the transistors T28,T29, the third signal path comprises the transistors T38,T39, the fourth signal path comprises the transistors T48,T49 and the fifth signal path comprises the transistors T58,T59. The coupled emitters of each transistor pair are connected to a power supply voltage Ucc via a (first, second, third, fourth and fifth) current source I1,I2,I3,I4 and I5, respectively. The base terminals of the first transistors of the signal paths T18,T28,T38,T48 and T58 constitute positive signal inputs p1,p2,p3,p4 and p5, respectively, of the first, second, third, fourth and fifth signal paths. In a corresponding manner, the base terminals of the second transistors T19,T29,T39,T49 and T59 constitute negative signal inputs n1,n2,n3,n4 and n5, respectively, of the first, second, third, fourth and fifth signal paths. The collectors of all first transistors T18,T28,T38,T48 and T58 of all signal paths are interconnected and connected to the collector of an output transistor Ti of an input current mirror, and to an input of a common output stage 3 of all signal paths T18, etc. In a corresponding manner, the collectors of the second transistors T19,T29,T39,T49 and T59 of all signal paths are interconnected and connected to the collector and the base of an input transistor T2 of the input current mirror of the common output stage 3 of all signal paths T18, etc. The emitter terminals of the input transistor T2 and the output transistor T1 of the input current mirror to the common output stage 3 are connected to a second reference potential 2, i.e., ground in this case. Also the common output stage 3 is connected to the power supply voltage Ucc and ground 2. Different useful signals, for example, audio signals may be applied via the signal inputs n1,p1 to n5,p5 of the signal paths. However, these useful signals are passed on to the input current mirrors T1, T2 by that signal path whose associated controllable current sources I1 to I5 are enabled, i.e., they supply a current for feeding the corresponding differential amplifier stage. The controllable current sources I1 to I5 are enabled by a first, a second, a third, a fourth or a fifth logic signal s1,s2,s3,s4 or s5. In the conventional mode of operation of the circuit arrangement shown in FIG. 1, the logic signals s1 to s5 are selected in such a way that each time only one of the controllable current sources I1 to I5 is enabled. The useful signal from the associated signal inputs n1,p1 to n5,p5 is then supplied from the output Aus of the common output stage of all signal paths.

Figure 2:
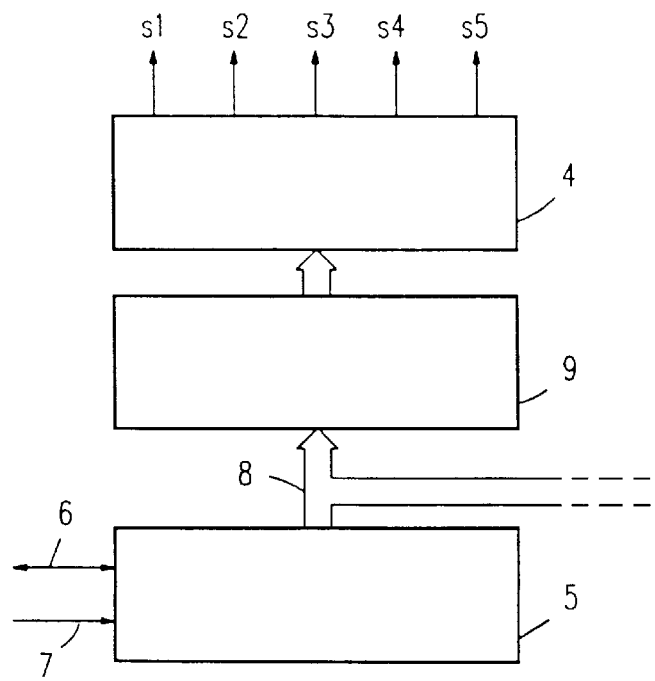
FIG. 2 shows a data transmission device in which the present invention is used.

An operational amplifier arrangement of this type, which, in principle, is known from DE-OS 43 32 658, may be preferably controlled with logic signals s1 to s5 which can be derived from, for example, a circuit arrangement as shown in FIG. 2. This data transmission device shown in FIG. 2 is particularly adapted to derive the logic signals s1 to s5 from an I$^2$C bus. To this end, the data transmission device shown in FIG. 2 comprises an interface circuit 5 which receives data in a serial form via a data line 6. The fact that, within the scope of the I$^2$C bus protocol, data can also be supplied in a serial form by the interface circuit on the data line 6 is of subordinate importance for the present invention. Moreover, the interface circuit 5 has a clock connection 7 for supplying a clock signal in a serial form by which the transmission of data on the data line 6 is controlled. The interface circuit 5 converts the serial data into parallel data and applies them to a memory 9 via a line 8. The stored data are supplied from the memory 9 to a "1 of n" decoder which generates the logic signals s1 to s5 therefrom and supplies these signals via corresponding outputs.

When the operational amplifier shown in FIG. 1 is used with a data transmission device shown in FIG. 2, a corresponding set of data is stored in the memory 9 for each operating state of the operational amplifier, i.e., for each operating state of its signal paths, and this set of data is retained in the memory 9 during the period when this operating state is active. If data for a new operating state are transmitted via the data line 6, the operational amplifier shown in FIG. 1 switches over as soon as the data have reached the memory 9 in which they have overwritten the data for the current operating state of the operational amplifier and corresponding logic signals s1 to s5 have been generated by the "1 of n" decoder. An abrupt transition, beset with interference, of the operating state of the operational amplifier is then obtained.

Figure 3:
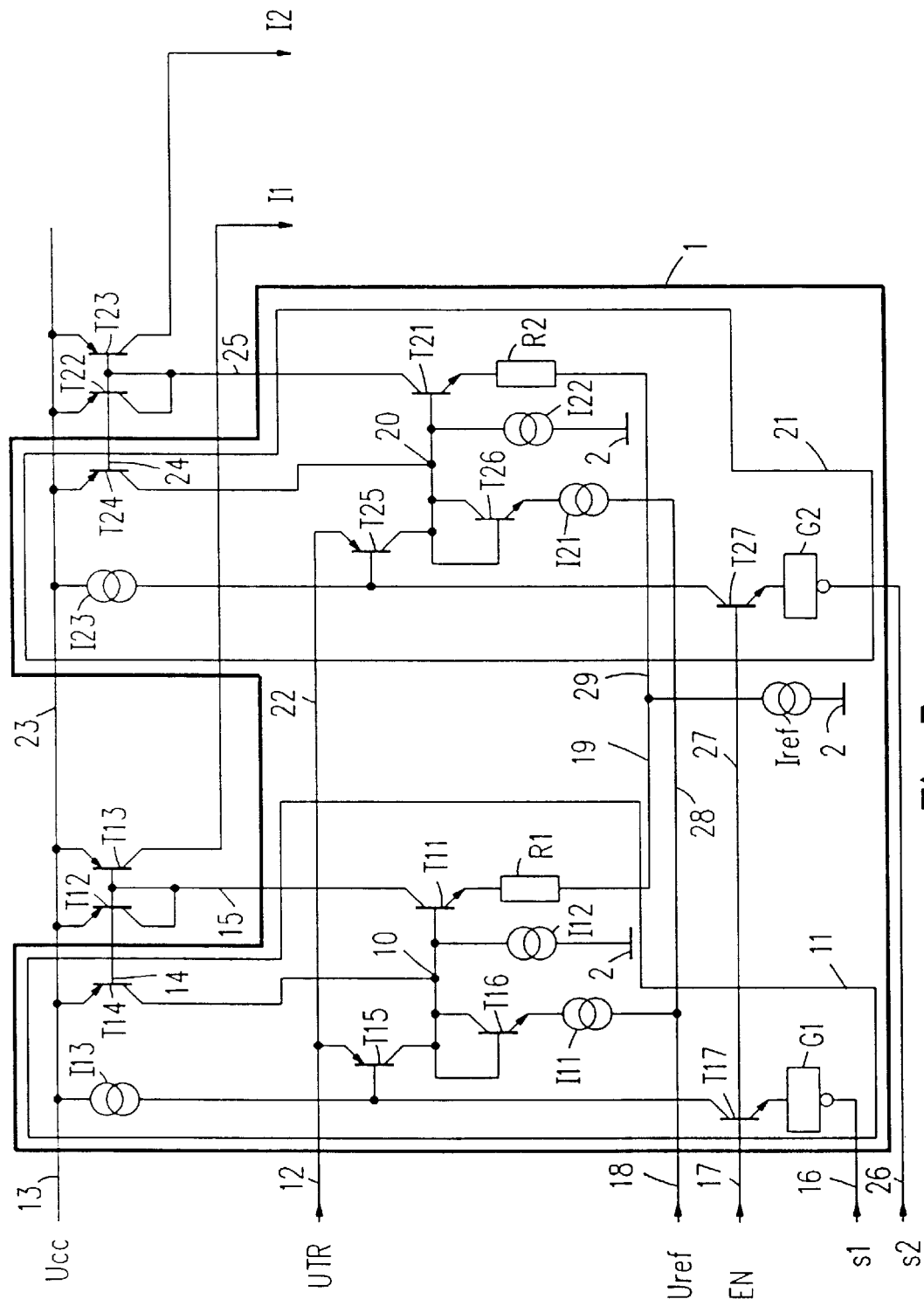
FIG. 3 shows a first embodiment of a selection circuit according to the invention.

To obtain an interference-free transition, using a small number of components, instead of this abrupt, interference-beset transition between the operating states of the operational amplifier shown in FIG. 1, i.e., upon the change-over between the two signal paths, a selection circuit according to the invention as shown by way of example for two signal paths in FIG. 3 and denoted by the reference numeral 1 is incorporated in the connections for the logic signals s1, etc. The selection circuit 1 shown in FIG. 3 comprises a first control stage 11, a second control stage 21 and a common reference current source Iref. The dimensioning of the reference current source Iref is at least essentially independent of the number of control stages 11, 21 in the selection circuit 1, which, on the one hand, has a favorable effect on the current consumption of a selection circuit 1 implemented for a larger number of signal paths and, on the other hand, simplifies their dimensioning.

The selection circuit 1 has a signal input 16,26 for the first and the second logic signal s1, s2, respectively. The control stages 11,21 are connected via outputs 15,25 to the associated controllable current sources I1,I2, respectively, which are each constituted by a current-mirror circuit in FIG. 3. The current-mirror circuit of the first controllable current source I1 comprises a transistor T12 as an input branch and a transistor T13 as an output branch; in a corresponding manner, the current-mirror circuit of the second controllable current source I1 comprises a transistor T22 as an input branch and a further transistor T23 as an output branch. The base terminals of the transistors T12,T13 are interconnected and connected to the collector of the transistor T12 of the input branch; there is also a corresponding interconnection of the transistors T22,T23 of the current-mirror circuit of the second controllable current source. All transistors T12,T13, T22,T23 are of the PNP type and their emitters are connected to the power supply voltage Ucc. The currents of the current sources I1 and I2 for feeding the differential amplifier stages T18, etc., are taken from the collectors of the transistors T13 and T23, respectively, of the output branches. The input branches T12, T22 are connected to outputs 15, 25 of the second control stage 11, 21, respectively. The controllable current sources I1,I2 are enabled via these outputs 15,25 instead of directly by the logic signals s1,s2. The first control stage 11 comprises a first analog multiplexer branch consisting of a transistor T11 constituting a control element and an emitter resistor R1. The control element T11 in FIG. 3 is of the NPN type; its collector constitutes the output 15 of the first multiplexer branch and its emitter is connected via the emitter resistor R1 to a terminal 19 to which the reference current source Iref is connected at one side. In a corresponding manner, the second control stage comprises a second analog multiplexer branch consisting of a control element T21 and an emitter resistor R2, which branch is arranged between the output 25 and a terminal 29. The terminal 29 is also connected to the reference current source Iref at the same side as the first multiplexer branch T11,R1; the other terminal of the reference current source Iref is connected to the second reference potential (ground) 2.

The first control stage 11 further comprises a first bistable stage consisting of a first constant-current source I11, a second constant-current source I12, a holding-current branch (transistor) T14 and a potential-shift element T16. The emitter of the PNP transistor constituting the holding-current branch T14 is connected to the power supply voltage Ucc. The collector of the transistor 14 and a terminal of the second constant-current source I12 are interconnected at a junction point 10 to which also the potential-shift element T16 is connected. In FIG. 3, this element consists of an NPN transistor whose collector and base are connected to the junction point 10. The emitter of the potential-shift element T16 is connected via the first constant-current source I11 to a terminal 18 for a first reference potential Uref, whereas the second constant-current source I12 is connected to ground 2 at the other side. The junction point 10 is further connected to the base terminal of the control element T11 of the first multiplexer branch.

In a corresponding manner, the second control stage 21 comprises a second bistable stage consisting of a first constant-current source I21 and a second constant-current source I22 of this second bistable stage, a holding-current branch T24 and a potential-shift element T26 which are similarly interconnected and connected to the base terminal of the control element T21 of the second analog multiplexer branch at a junction point 20.

The connection of the first and second control stages 11 and 21 to the power supply voltage Ucc is realized via power supply terminals 13 and 23, respectively. The base terminals of the holding-current branches T14 and T24 are connected via holding-current control terminals 14 and 24 of the first and second control stages 11 and 21 to the associated outputs 15 and 25 of the first and second multiplexer branch, respectively, such that the holding-current branches T14 and T24 are controlled jointly with the input branches T12 and T22 of the controllable current sources I1 and I2, respectively.

Furthermore, the first control stage 11 comprises a first switching stage consisting of a third constant-current source I13 and a switching element T15 which is constituted as a PNP transistor. The third constant-current source I13 of the first switching stage is connected to the power supply voltage Ucc via the power supply terminal 13 and to the base terminal of the transistor T15 constituting the switching element. The collector of the transistor 15 is connected to the junction point 10.

Connected in a corresponding manner, a third constant-current source I23 of the second control stage 21 and a switching element T25 constitute a second switching stage in the second control stage, which switching stage is similarly connected to the power supply terminal 23 of the second control stage 21 and to the junction point 20.

From the base terminal of the switching element T15, there is a connection between the first switching stage and the logic signal input 16 of the first control stage. In FIG. 3, this connection is established via an inhibiting stage 17 and an inverter G1. The inhibiting stage consists of an NPN transistor whose collector is connected to the base terminal of the transistor T15 (switching element) and its emitter is connected to the output of the inverter G1. The base terminal of the transistor T17 constituting the inhibiting stage constitutes an enable signal input 17 of the first control stage 11.

In a corresponding arrangement, the second control stage 21 comprises an inhibiting stage T27 and an inverter G2. The base terminal of the inhibiting stage T27 constitutes an enable signal input 27 of the second control stage 21 which is connected to the enable signal input 17 of the first control stage 11.

In a manner corresponding to that for the first control stage 11, the second control stage 21 receives the first reference potential Uref via a terminal 28.

The emitters of the switching elements T15 and T25 constitute control signal inputs 12 and 22 of the first and second control stages 11 and 21, respectively, for supplying a control signal UTR. During operation, the enable signal EN is applied to the enable signal inputs 17 and 27.

Figure 4A:
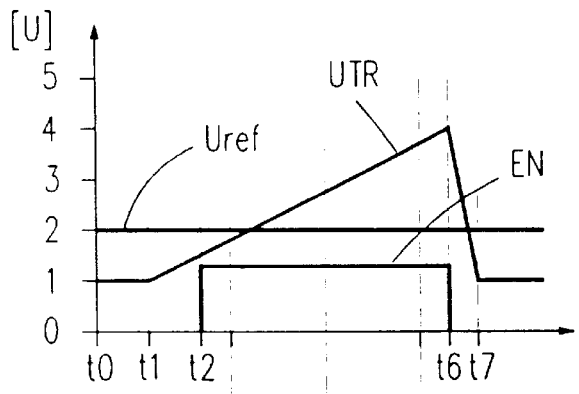
FIGS. 4A, 4B, 5A and 5B show signal characteristics for two embodiments of the invention.
Figure 4B:
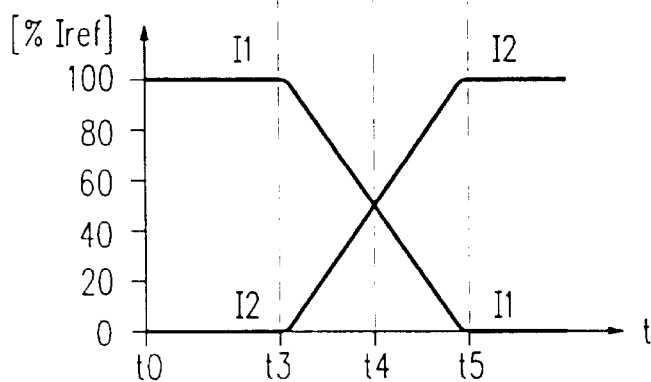

The function of the circuit arrangement shown in FIG. 3 will hereinafter be described with reference to the diagrams in FIGS. 4A and 4B, in which FIG. 4A shows different signals plotted on a voltage axis U as a function of time t, and FIG. 4B shows the variations of the currents from the controllable current sources I1 and I2 in the transition interval.

To explain the function of the selection circuit 1 shown in FIG. 3, it is assumed that there is an "idle state" at the instant t0, i.e., the first signal path T18,T19 with the first controllable current source I1 is enabled, whereas all other signal paths, i.e., the second controllable current source I2 in FIG. 3, are disabled. This operating state is continuous until the instant t0. The first logic signal s1 then assumes a high signal level as the first signal level, whereas the second logic signal s2 (and possibly further logic signals for further control stages) assume a low signal level as the second signal level. However, since the common enable signal EN is at the low signal level until the instant t0 and thus interrupts the further supply of the logic signals s1,s2 via the inhibiting stages T17 and T27, their value and also their variation with respect to time outside the transition interval has no influence on the operating state of the selection circuit 1. The control signal UTR also assumes a low value. To clarify this signal, the scale on the voltage axis U in the diagram in FIG. 4A may be in volts; for example, the control signal UTR then assumes a voltage of 1 V outside the transition interval. Moreover, this example in FIG. 4A shows that the first reference potential Uref is fixed at two volts; all voltages are indicated with respect to the second reference potential 2 (ground). The power supply voltage Ucc may be, for example, five volts.

In this operating state, the switching elements T15,T25 of the control stages 11,21 are inhibited by the third constant-current sources I13 and I23 of the first and second switching stage, respectively, so that also the control signal UTR cannot influence any one of the two control stages 11,21 in FIG. 3. In the first control stage 11 of the first controllable current source I1 enabled at the instant t0, the current enabling the first controllable current source flows from the input branch T12 to the output 15 of the first multiplexer branch and hence via the collector and the emitter of the control element T11 and the emitter resistor R1, which current reaches the reference current source Iref via the terminal. Controlled by the input branch T12 via the holding-current control terminal 14, also the holding-current branch T14 of the first control stage 11 conveys a current which is applied to the junction point 10 and is distributed across the potential-shift element T16 with the first constant-current source I11 of the first bistable stage as well as the second constant-current source I12 and the base terminal of the control element T11. This holding current from the holding-current branch T14 renders the first bistable stage I11,I12, T14,T16 and hence the control element T11 independent in the state of operation described, and particularly independent of the logic signals S1,S2 or also independent of the control signal UTR. The current which can be supplied by the first constant-current source I11 is then dimensioned in such a way that it is larger than the current supplied by the reference current source Iref and is thus also larger than the current which can be maximally supplied via the holding-current branch T14. On the other hand, the current which can be supplied by the second constant-current source I12 is dimensioned to be very small as compared with the current supplied by the reference current source Iref so that it is negligible in the afore-described operating state of the first control stage 11. As a result, the first constant-current source I11 initially remains saturated. The base terminal of the control element T11 is thereby clamped to a potential via the transistor T16, which is arranged as a diode and constitutes the potential-shift element, and the first constant-current source I11, which potential is determined by the first reference potential Uref and the voltage at the potential-shift element T16. In the relevant example, this potential is approximately 0.7 V higher than the first reference potential Uref, i.e., it is, for example approximately 2.7 V.

In the second control stage 21, however, the second controllable current source I2 and hence the holding-current branch T24 connected thereto are inhibited. The first constant-current source I21 and the second constant-current source I22 of the second bistable stage of the second control stage 21 inhibit the potential-shift element G26, on the one hand, and the control element T21 of the second analog multiplexer branch, on the other hand. The inhibited state of the control element T21 is also supported in that a potential which is positive with respect to ground 2 is present at the terminal 29 for the reference current source Iref.

To explain the function of the control stage shown in FIG. 3, it will now be assumed that, during the transition interval, the first controllable current source and hence the first signal path fed by this source is disabled, whereas the second signal path is enabled via the second controllable current source I2. Before the start of the transition interval, but preferably up to an instant t1 in the diagram in FIGS. 4A and 4B, the data required for generating the corresponding logic signals s1,s2 are taken up in a serial form by the data line 6 in the data transmission device shown in FIG. 2, and the logic signals s1,s2 (and possibly further signals) formed therefrom are made available at the associated outputs of the "1 of n" decoder 4. When these data are being made available, i.e., for logic signal switching processes generally required for this purpose, the variation with respect to time of these signals need not be carefully considered because the logic signals at this instant do not yet have any effect on the signal paths. In the relevant example, the second logic signal s2 assumes the first (high) signal level after termination of the afore-mentioned switching processes, whereas the first logic signal s1 assumes the second (low) signal level.

The control signal UTR which has an unchanged level up to the instant t1 is continuously changed as from the instant t1. In the example shown in FIG. 4A, a sawtooth-shaped slope with a constant rise is provided for the control signal UTR from the instant t1. However, this (time-continuous) change of the control signal UTR does not influence the control stages 11,21 because, also after the instant t1, the enable signal EN initially still remains at the low signal level so that the switching elements T15,T25 remain inhibited. The sawtooth-shaped variation of the control signal UTR shown can then be applied to the control signal inputs 12,22 of a delta voltage generator (not shown) of a conventional structure.

It is not until the instant t2 that the enable signal EN is switched over to the high signal level. As a result, the inhibiting stages T17,T27 are rendered conducting, i.e. the logic signals s1,s2 conveyed via the inverters G1,G2 can now reach the first and second switching stages I13,T15 and I23,T25, respectively. In the relevant example, a high signal level is present at the output of the inverter G1 of the first control stage 11, because the associated first logic signal 1 has a low signal level. Conversely, the inverter G2 of the second control stage 21 supplies a low signal level at the output. A high signal level is then present at the base terminal of the switching element T15. Consequently, the switching element T15 is further inhibited because the variation of the control signal UTR is adapted in such a way that its value does not exceed the high signal level. However, the current of the third constant-current source I23 of the second switching stage is derived via the inhibiting stage 27 of the second control stage 21. The potential at the base terminal of the switching element T25 follows the potential at the output of the inverter G2 via the conducting inhibiting stage T27. The switching element T25 then becomes conducting and the control signal UTR is applied from the control signal input 22 to the junction point 20 and hence to the base terminal of the control element T21 of the second control stage 21. With an increase of the value of the control signal UTR, this signal may render the control element T21 conducting. This conducting state is reached at the instant t3 in the curve shown by way of example in FIGS. 4A and 4B.

As from the instant t2, the control elements T11,T21 constitute a differential amplifier with the reference current source Iref as a common emitter current source. Between the instants t2 and t3, this differential amplifier still retains the state in which one of its branches is completely conducting and the other is completely non-conducting. However, at the instant t3, this differential amplifier changes over to its linear control range which is also influenced by the emitter resistors R1,R2 which are preferably identical. As from the instant t3, and with a further increase of the value of the control signal UTR, the control element T21 increasingly conveys a current at a value by which the current through the control element T11 of the first control stage 11 is reduced due to the constant current of the reference current source Iref. In accordance with the now continuously changing currents in the control elements T11,T21, the first controllable current source I1 is gradually disabled and the second controllable current source I2 is gradually enabled via the input branches T12,T22. The holding currents in the holding-current branches T14 and T24 then change in the same sense. However, this change of the holding currents does not yet have an essential influence on the bistable stages of the control stages 11,21, because the potential at the junction point 10 remains initially further constant via the further conducting potential-shift element T16 and the first constant-current source 11 of the first bistable stage, and the voltage at the junction point 20 is defined by the control signal UTR. This ensures that during the transition interval, starting at the instant t3 for the controllable current sources I1,I2, the change-over of the connected signal paths is precisely determined by the control signal UTR.

At the instant t4, the value of the voltage at the junction point 20 reaches the value of the voltage at the junction point 10, due to the control signal UTR. The voltages at the base terminals of the control elements T11,T21 and thus also the currents in the controllable current sources I1,I2 are then equal. Upon a further increasing value of the control signal UTR, the current in the second controllable current source I2 is further increased; accordingly, the current in the first controllable current source I1 decreases. Now, the holding currents in the holding-current branches T14,T24 also undergo the corresponding changes. The potential-shift element T26 will then become gradually conducting; however, the current now conveyed via the potential-shift element T24 by the first constant-current source I21 of the second bistable stage can be supplied via the switching element T25 in so far as it cannot yet be supplied from the holding-current branch T24. Therefore, the control element T21 is initially not influenced.

At the instant t5, the decreasing holding current from the holding-current branch T14 of the first control stage 11 falls below the value of the current supplied by the second constant-current source I12 of the first bistable stage. Therefore, the base terminal of the control element T11 is controlled at the second reference potential (ground) via the second constant-current source I12 of the first bistable stage, whereby the control element T11 is inhibited with certainty. Then, no current flows anymore in the input branch T12 of the first controllable current source I1; the first controllable current source I1 and the first signal path fed by the source are thereby disabled. The current from the reference current source Iref is now completely taken over by the control element T21 of the second control stage 21. A further increase of the value of the control signal UTR beyond the instant t5 thus does not lead to a further increase of the current of the second controllable current source I2.

At the instant t6, the sawtooth-shaped rise of the control signal UTR is thus ended and simultaneously the enable signal EN is switched back to a low signal level.

Consequently, the voltage at the junction point 20 drops to the value at which it is clamped by the holding current now flowing through the holding-current branch T24, which holding current flows off via the constant-current sources I21,I22 of the second bistable stage, with the inclusion of the potential-shift element T26, and via the base terminal of the control element T21. The voltage at the junction point 20 then adjusts at the value which is determined by the first reference potential Uref, essentially increased by the voltage at the potential-shift element T26. This state is maintained, even after drop-out of a current through the switching element T25 after a decrease of the voltage value of the control signal UTR or after switching off the switching elements T15,T25 by the enable signal EN via the inhibiting stages T17,T27. The control element T11 of the first analog multiplexer branch also remains in the inhibited state which it had reached at the instant t6.

In FIG. 4A, the control signal UTR has decreased at the instant t7 to the value again which it had before the instant t1. The transition from one signal path to the other is thereby concluded at the instant t7; a further transition may follow. In accordance with the specification and on the basis of the variations as a function of time of the currents in the controllable current sources, the interval between the instants t3 and t5 is denoted as transition interval and the instant t5 is thus denoted as the termination of the transition interval. The periods of time before the instant t2 and after the instant t6, in which, conditioned by the variation of the enable signal EN, no transition takes place, can thus be considered to be situated outside the transition interval.

Figure 5A:
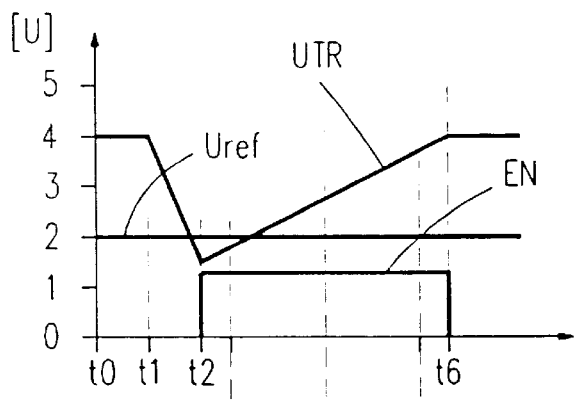
Figure 5B:
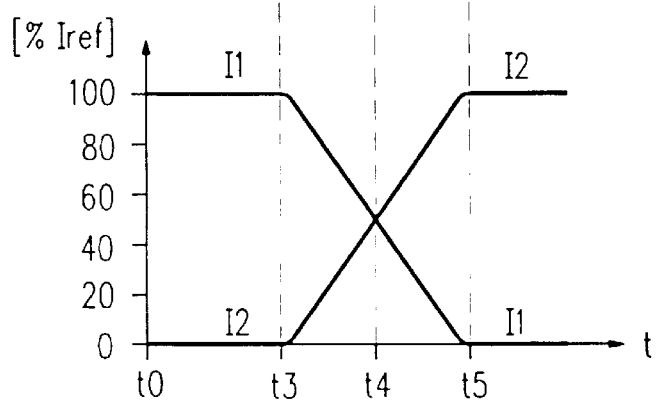

In the described embodiment of the invention, the shown, time-linear change of the control signal UTR and adequately large dimensioned emitter resistors R1,R2 ensure that the currents in the controllable current sources I1,I2 are also submitted to time-linear changes in the transition interval. These situations may vary in different ways. For example, FIGS. 5A and 5B show a case with an equally sawtooth-shaped control signal UTR, which is only different from that in FIGS. 4A and 4B in that it assumes a high signal level in the idle state, which level rapidly drops off to a minimal value in the interval between the instants t1 and t2 and subsequently shows a time-linear increase at the instant t6. This modification of the invention may have the advantage that the time interval between the instants t1 and t2 can be utilized for suppressing needle pulses which may be produced by gate delay times in the data transmission device. The enable signal EN can then be active during the entire rise time of the control signal UTR, which rise time, in contrast to FIGS. 4A and 4B, fills up the time interval between the instants t2 and t6. A further advantage of this modification is the possibility of reducing the number of components for generating the enable signal EN and of better utilizing the duration of the sawtooth-shaped rise of the control signal UTR for the transition process, i.e., the transition between two signal paths.

Instead of a time-linear change of the control signal UTR in the transition interval, it is also possible to choose a distorted shape with a varying slope. For special applications, a non-linear current transition from one signal path to the other may be achieved with this choice and with an appropriate dimensioning of the emitter resistors R1,R2.

In a reproducing device for an audio signal, the setting members for volume, balance and fading may be spread among a plurality of operational amplifiers of the type shown in FIG. 1. This may necessitate the possibility of simultaneously changing the setting of the signal paths of the individual operational amplifiers. In the circuit arrangement, according to the invention, only a single control signal UTR and thus also only a single generator for generating such a control signal UTR is required for this purpose. However, for each operational amplifier, a separate enable signal EN may be preferably generated, which must be synchronized with the—"centrally" predetermined— waveforms of the control signal UTR.

Figure 6:
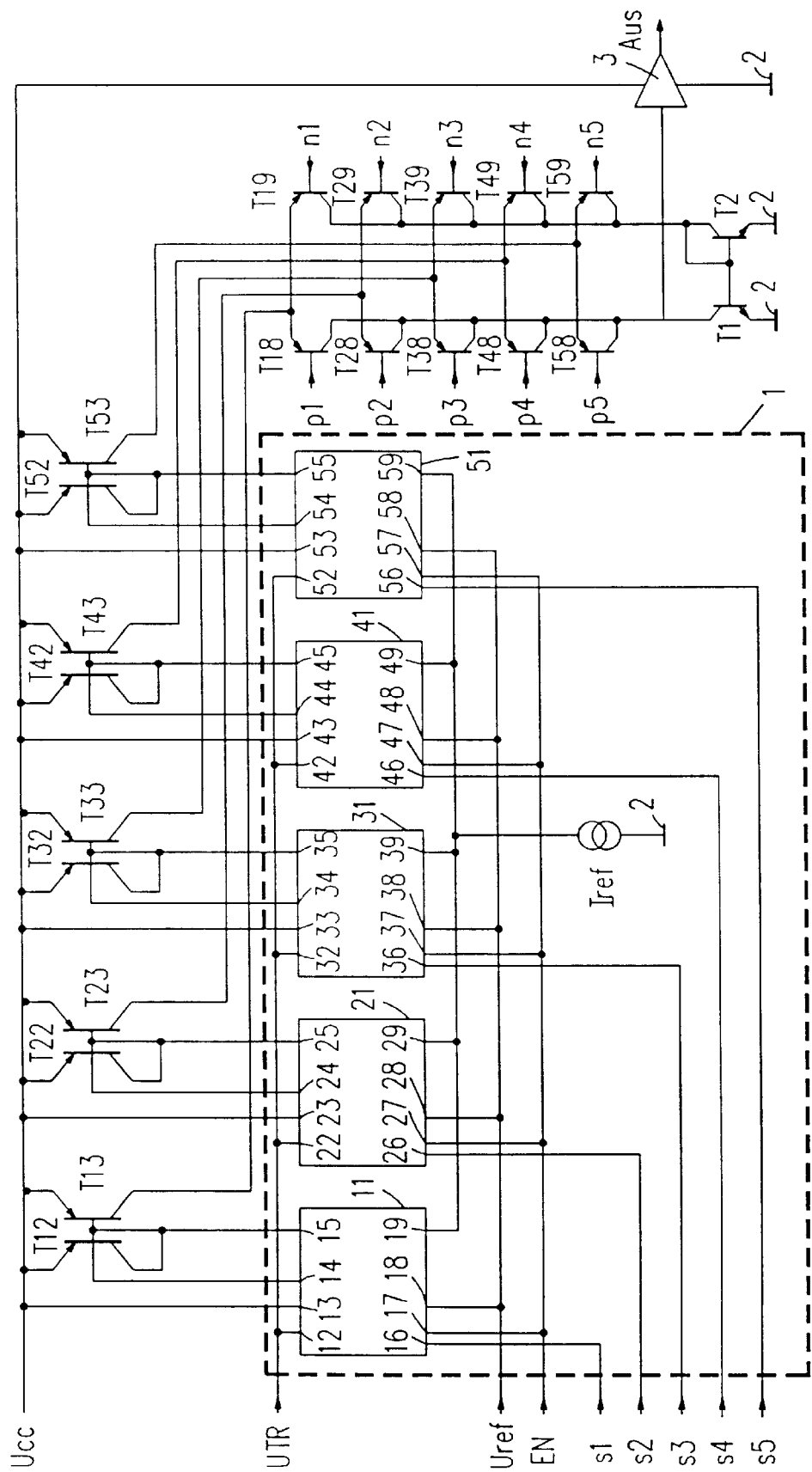
FIG. 6 shows a second embodiment of the circuit arrangement according to the invention.

FIG. 6 shows a further embodiment of a circuit arrangement according to the invention, in which the selection circuit 1 has an overall number of five control stages 11,21,31,41,51. The third, fourth and fifth control stages 31,41 and 51 have a structure which is identical to that of the first and second control stages 11 and 21, respectively. In accordance with FIG. 3, each control stage is connected to one of the controllable current sources I1,I2,I3,I4 and I5, in which the third, fourth and fifth controllable current sources I3,I4 and I5, similarly as the first and second controllable current sources I1 and I2, each have an input branch T32,T42 and T52 and an output branch T33,T43 and T53, respectively, which also each constitute a current-mirror circuit. Signal paths and common output stage 3 correspond to those in FIG. 1.

In FIG. 6, the control stages 11,21,31,41,51 are shown only in a block-diagrammatic form because they have the same structure as those in FIG. 3. Only their terminals, which are also identical, are individually denoted in FIG. 6. The control signal inputs 12,22,32,42,52 of all control stages 11,21,31,41,51 are interconnected for jointly supplying the control signal UTR. The power supply voltage Ucc is also applied to each control stage 11,21,31,41,51 via a power supply terminal 13,23,33,43,53, respectively. The reference current source Iref is not only connected to the first and second control stages 11 and 21 but also to the other control stages 31,41,51 via corresponding terminals 39,49 and 59, respectively, and the first reference potential Uref is applied to the control stages 31,41,51 via terminals 38,48 and 58, respectively. Moreover, the enable signal EN which is applied to the third, fourth and fifth control stages 31,41 and 51 via enable signal inputs 37,47 and 57, respectively, is common for all control stages 11 to 51. Moreover, the three control stages 31,41,51 in FIG. 6, which are additional stages with respect to those in FIG. 3, each have a holding-current control terminal 34,44 and 54, an output 35 of a multiplexer branch (not explicitly shown) comprised in the respective control stage, as well as a logic signal input 36,46 and 56, respectively. These inputs receive the logic signals s3,s4 and s5, respectively.

It will be evident that in FIG. 6 a change-over from one arbitrary control stage to another arbitrary control stage by the logic signals s1 to s5 is optionally possible.

In practice, arrangements having an essentially higher number of signal paths can also be manufactured without any problems.

The circuit arrangement according to the invention provides the economic possibility of eliminating the existing drawbacks of state-of-the-art circuits while using only a small number of components. The additionally required parts of the circuit arrangement, i.e. the selection circuit with the control stages, can be directly joined with the controllable current sources which are required anyway and extended, as far as their combination with the control circuits is concerned, to storage circuits having a controllable behaviour at the transition between two signal paths. Interferences in the logic signals, particularly needle pulses, can be suppressed without any additional components.

We claim:

1. A circuit arrangement having at least two signal paths which can be alternately enabled by feeding respective controllable current sources and by means of logic signals selecting one of these controllable current sources, while, at a transition from one signal path to the other, said controllable current sources of the relevant two signal paths are controllable by means of a time-continuously changing control signal during a transition interval, such that currents supplied by these two controllable current sources change continuously and in opposite directions, characterized in that said circuit arrangement comprises a selection circuit comprising a control stage for each signal path, each control stage comprising:

an analog multiplexer branch for passing a current for enabling the controllable current source associated with the relevant signal path, a reference current source for supplying said current, said reference current source being common to the analog multiplexer branches of all control stages;

a bistable stage for continuously controlling the current in the analog multiplexer branch in accordance with the control signal and for storing the state of operation, achieved at the end of the transition interval, of the analog multiplexer branch outside the transition interval; and a switching stage for applying the control signal during the transition interval, by means of the logic signals and via the bistable stage, to the analog multiplexer branch of that signal path which is to be enabled in accordance with the logic signals after termination of the transition interval.

2. A circuit arrangement as claimed in claim 1, characterized in that each control stage comprises an inhibiting stage, a common enable signal being applicable to all inhibiting stages, said common enable signal switching over said inhibiting stages during the transition interval so as to apply the logic signals to the switching stages, and outside the transition interval so as to interrupt the supply of the logic signals.

3. A circuit arrangement as claimed in claim 1, characterized in that each of the logic signals is allocated to a respective control stage, and in that a respective one of said logic signals assumes a first signal level for enabling the associated signal path after termination of the next transition interval, while, simultaneously, all of the other logic signals assume a second signal level.

4. A circuit arrangement as claimed in claim 3, characterized in that each control stage comprises an inverter for applying the allocated logic signal to the associated switching stage and inhibiting stage.

5. A circuit arrangement as claimed in claim 1, characterized in that each controllable current source comprises a current-mirror circuit having an input branch for receiving the current enabling the controllable current source from the associated multiplexer branch, and an output branch which feeds the associated signal path.

6. A circuit arrangement as claimed in claim 5, characterized in that each bistable stage comprises a holding-current branch which is controllable by the input branch of the associated controllable current source, said holding-current branch supplying a holding current for storing the corresponding state of operation of the associated multiplexer branch when the associated signal path is enabled.

7. A circuit arrangement as claimed in claim 6, characterized in that each bistable stage also comprises a first constant-current source connected to a first reference potential and, via a potential-shift element, to a junction point with the holding-current branch, and a second constant-current source connected to the junction point and to a second reference potential.

8. A circuit arrangement as claimed in claim 7, characterized in that the first reference potential is higher than the second reference potential.

9. A circuit arrangement as claimed in claim 7, wherein each multiplexer branch comprises a control element having a control terminal connected to the associated bistable stage, characterized in that the control element comprises a transistor having a control terminal connected to the junction point in the associated bistable stage.

10. A circuit arrangement as claimed in claim 9, characterized in that each switching stage comprises a switching element having a control terminal for receiving the allocated logic signal, the control signal being applied by the switching element to the junction point of the associated bistable stage.

11. A circuit arrangement as claimed in claim 1, characterized in that each multiplexer branch comprises a control element having a control terminal connected to the associated bistable stage.

12. A circuit arrangement as claimed in claim 1, characterized in that, during the transition interval, the control signal has an at least substantially sawtooth-shaped waveform as a function of time.

13. A circuit arrangement as claimed in claim 1, characterized in that each signal path comprises a differential amplifier stage fed by the associated controllable current source, said differential stages being enabled only when a current is received from the associated controllable current source.

14. A circuit arrangement as claimed in claim 13, characterized in that the outputs of all differential amplifier stages are connected to a common output stage.

* * * * *